(12) United States Patent
Yasuda et al.

(10) Patent No.: US 10,658,588 B2
(45) Date of Patent: May 19, 2020

(54) MEMORY CELL SWITCH DEVICE

(71) Applicants: Shuichiro Yasuda, Boise, ID (US); Tomohito Tsushima, Boise, ID (US)

(72) Inventors: Shuichiro Yasuda, Boise, ID (US); Tomohito Tsushima, Boise, ID (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/480,782

(22) Filed: Apr. 6, 2017

(65) Prior Publication Data

US 2018/0294408 A1  Oct. 11, 2018

(51) Int. Cl.

| | |
|---|---|
| *H04L 12/28* | (2006.01) |
| *H01L 45/00* | (2006.01) |
| *H01L 27/24* | (2006.01) |
| *G11C 13/00* | (2006.01) |
| *C23C 14/06* | (2006.01) |
| *H01L 21/02* | (2006.01) |
| *H01L 27/02* | (2006.01) |

(52) U.S. Cl.
CPC ........ *H01L 45/147* (2013.01); *C23C 14/0617* (2013.01); *G11C 13/003* (2013.01); *G11C 13/0011* (2013.01); *G11C 13/0033* (2013.01); *H01L 21/02178* (2013.01); *H01L 21/02186* (2013.01); *H01L 27/02* (2013.01); *H01L 27/2427* (2013.01); *H01L 27/2463* (2013.01); *H01L 45/04* (2013.01); *H01L 45/1233* (2013.01); *H01L 45/1253* (2013.01); *H01L 45/141* (2013.01); *H01L 45/16* (2013.01); *G11C 2213/11* (2013.01); *G11C 2213/12* (2013.01); *G11C 2213/52* (2013.01); *G11C 2213/56* (2013.01); *G11C 2213/71* (2013.01); *G11C 2213/76* (2013.01); *H01L 45/08* (2013.01); *H01L 45/085* (2013.01)

(58) Field of Classification Search
CPC ........................................................ H04L 12/28
USPC ........................................................ 370/329
See application file for complete search history.

(56) References Cited

U.S. PATENT DOCUMENTS

| | | | |
|---|---|---|---|
| 7,224,016 B2 * | 5/2007 | Nakamura | H01L 21/7687 257/296 |
| 2005/0029505 A1 | 2/2005 | Lowrey | |
| 2009/0196088 A1 | 8/2009 | Dittrich et al. | |
| 2014/0021433 A1 | 1/2014 | Dahmani | |
| 2014/0264223 A1 | 9/2014 | Tendulkar et al. | |
| 2016/0293419 A1 * | 10/2016 | Nam | H01L 23/528 |
| 2017/0098684 A1 * | 4/2017 | Ohba | H01L 27/2427 |
| 2017/0244028 A1 * | 8/2017 | Wang | H01L 45/08 |

OTHER PUBLICATIONS

International Search Report for International (PCT) Application No. PCT/JP2018/010864, dated Aug. 20, 2018, 8 pages.

* cited by examiner

*Primary Examiner* — Dang T Ton

(74) *Attorney, Agent, or Firm* — Sheridan Ross P.C.

(57) ABSTRACT

Memory structures with a plurality of memory cells that each include memory devices in combination with switch devices are provided. The memory device and switch device of each cell are connected in series, and include at least first and second electrodes. The first electrode features a relatively high resistance, to provide a reduced snap current during operation of the memory device. The first electrode with a relatively high resistance can contain or be entirely composed of TiAlN.

12 Claims, 5 Drawing Sheets

MEMORY CELL SWITCH DEVICE

FIELD

The present disclosure relates to memory structure having a plurality of memory cells. Each memory cell includes a switch device and a memory device.

BACKGROUND

Memory devices are used in a wide range of fields. For example, solid-state memory can be used for long or short term storage of program instructions and data in connection with computing devices. Memory density, access speed, and reliability are all important considerations in designing solid-state memory. Recent solid-state memory designs include resistance change memories, such as resistive random access memory (ReRAM), and phase-change random access memory (PCRAM or PRAM). These can be incorporated into three-dimensional architectures. Such designs can increase memory density. However, in a resistance change memory using an existing access transistor, a floor area per unit cell is increased. As a result, it is difficult to achieve increased memory density as compared to flash memories. However, it is possible to reduce a floor area per unit cell in a resistance change memory where the memory cells are disposed in a cross-point memory array configuration. In such a configuration, memory cells are provided at the cross points of intersecting wiring lines. Accordingly, an increase in memory density can be achieved.

In a memory cell of a cross-point memory array, a selection device or switch device for cell selection is provided in addition to the memory device. Examples of a switch device include a PN diode, an avalanche diode, a switch device configured with use of a metal oxide, and a switch device that is switched at a certain threshold voltage by Mott transition to abruptly increase a current. However, because of constraints on the threshold voltage at which the switch devices are switched, and because a leakage current during non-selection can be large, obtaining an adequate threshold voltage for a resistance change memory device using existing switch devices is problematic.

As an alternative, a switch device can incorporate a chalcogenide material, such as an ovonic threshold switch (OTS). An OTS device is characterized by a current that increases abruptly at a switching threshold voltage or higher. This makes it possible to obtain a relatively large current density when the switch device is placed in a selection (ON) state. Moreover, a microstructure of an OTS layer made of a chalcogenide material is amorphous, and it is therefore possible to form the OTS layer under room-temperature conditions using a physical vapor deposition (PVD) method or a chemical vapor deposition (CVD) method.

SUMMARY

In three-dimensional memory structures or arrays, resistance change memory cells can be densely packed within the memory array. However, the performance of the memory structure is at least partially dependent on the characteristics of the switch devices associated with the memory cells. In particular, it is desirable to provide a switch in which the current spike or snapping that results from activation of the switch device is reduced.

Embodiments of the present disclosure provide a switch device for use with a memory device that incorporates a relatively high resistance electrode. Using such an electrode, the peak current can be reduced as compared to conventional electrodes. In accordance with embodiments of the present disclosure, the electrode can contain titanium. More particularly, embodiments of the present disclosure provide an electrode, also referred to herein as a first electrode, that is formed using titanium aluminum nitride (TiAlN). In accordance with still other embodiments of the present disclosure, the first electrode is formed entirely from TiAlN.

In accordance with embodiments of the present disclosure, a switch device is provided. The switch device includes a first electrode that contains titanium. The switch device further includes a second electrode, and a switch layer that is between the first electrode and the second electrode. In accordance with at least some embodiments, the switch layer is formed using one or more kinds of chalcogen elements.

In accordance with further embodiments of the present disclosure, a storage unit is provided. The storage unit includes a plurality of memory cells. Each memory cell includes a switch device having a first electrode that includes titanium.

Methods in accordance with embodiments of the present disclosure include depositing on a substrate alternating layers of TiN and AlN. After a desired number of layers have been deposited, $NH_3$ annealing is performed, to obtain an electrode formed from TiAlN.

Additional features and advantages of embodiments of the present disclosure will become more readily apparent from the following description, particularly when taken together with the accompanying drawings.

DETAILED DESCRIPTION

Figure 1:
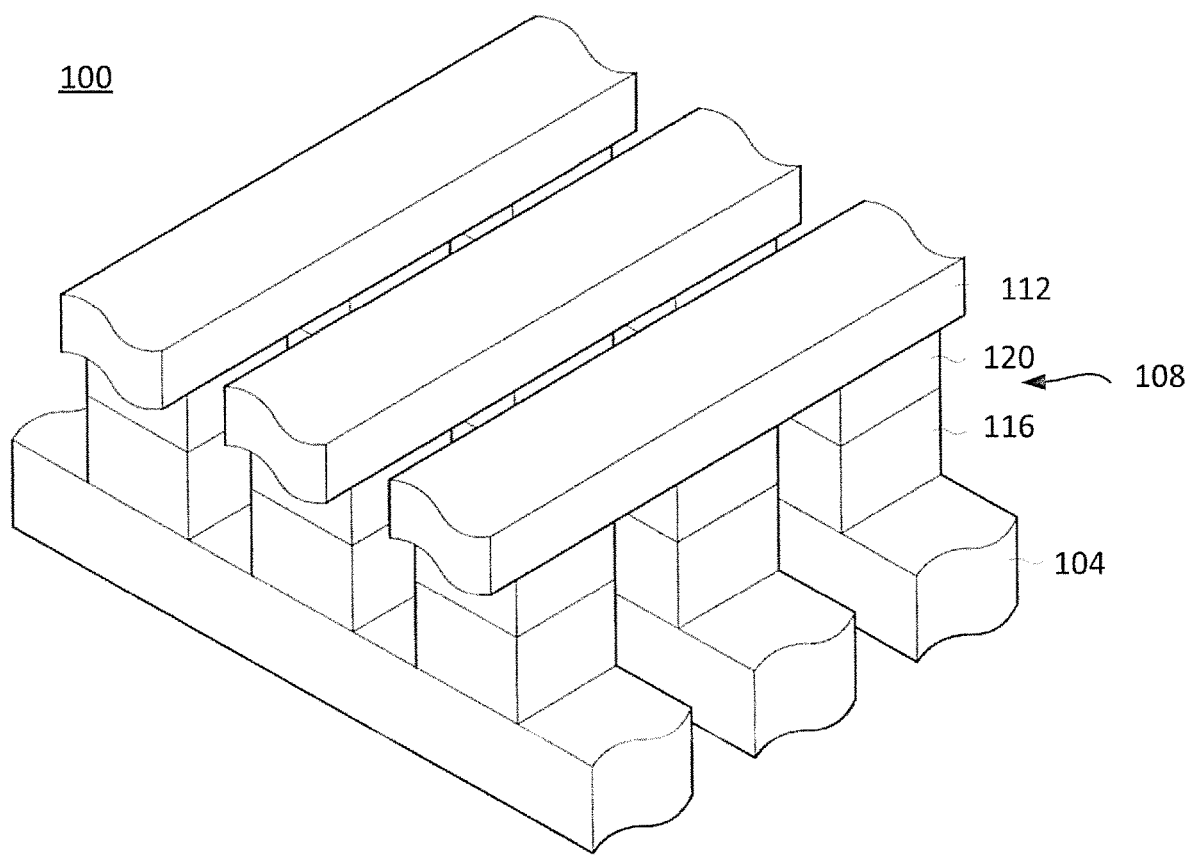
FIG. 1 is a perspective view of an exemplary three-dimensional memory structure.

FIG. 1 depicts an example three-dimensional memory structure 100. More particularly, a three-dimensional memory structure 100 in the form of a cross-point memory array is depicted. The memory structure 100 includes a plurality of bit lines 104 that are electrically connected to the ends of vertical memory elements or cells 108. The memory structure 100 also includes a plurality of word lines 112. More particularly, memory cells 108 are formed in areas that are adjacent crossing points or intersections between a bit line 104 and a word line 112. Although not shown in this example, a three-dimensional memory structure 100 in accordance with embodiments of the present disclosure can include a vertical memory array, with memory cells 108 that are disposed in three dimensions (x, y, z). The bit lines 104 and word lines 112 can be connected to drive elements (not illustrated).

The memory cells 108 each include a switch device 116 coupled in series to a memory or storage device 120. The switch device 116 of a memory cell 108 is used as a selector for that memory cell 108. In particular, by applying a voltage that is equal to or higher than a switching threshold voltage, the switch device 116 is placed in a low or decreased resistance state. When the voltage applied to the switch device 116 is less than the switching threshold voltage, the switch device 116 returns to a high resistance state. Preferably, the switch device 116 prevents a leakage current in the high resistance or OFF state, and allows a relatively high current density to flow in the low resistance or ON state. By applying a voltage across the memory cell 108, the switch device 116 can be transitioned from a high resistance state to a low resistance state. Once the switch device 116 is in the low resistance state, various operations, such as write, erase, and read operations can be performed with respect to the storage device 120.

The storage device 120 can include a resistance variation type storage device in which electric characteristics, and in particular a resistance value, of the storage device 120 are varied when a voltage pulse or a current pulse is applied across the storage device 120 from the associated bit line 104 and word line 112 pair and an unillustrated power supply circuit. As can be appreciated by one of skill in the art, the voltage levels and pulse durations used for different operations in relation to a selected memory cell 108 can depend on the specific characteristics of the storage device 120. It is to be noted that, in the storage device 120, the transmission path formed by the application of a voltage is maintained even after the applied voltage is discontinued, and the resistance value is maintained.

Figure 2:
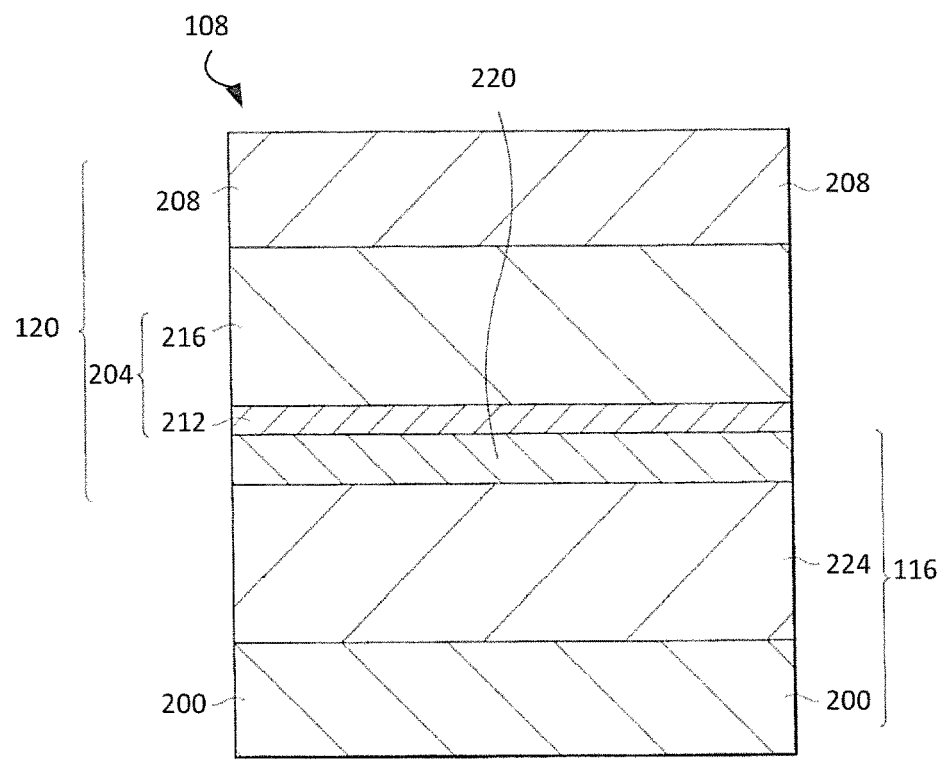
FIG. 2 is a cross-sectional view depicting a memory cell in accordance with embodiments of the present disclosure.

As illustrated in FIG. 2, a memory cell 108 may include, for example, a lower or first electrode 200, a switch layer 224, an intermediate or second electrode 220, a storage layer 204, and an upper or third electrode 208 in this order. The storage layer 204 may comprise a stacking configuration in which a resistance change layer 212 and an ion source layer 216 are stacked from the lower electrode side, or a single-layer configuration of the resistance change layer 212. It is to be noted that an the intermediate electrode 220 serves as both an upper electrode of the switch device 116 and a lower electrode of the storage device 120. More specifically, for example, the memory cell 108 may have a configuration in which the switch layer 224, the intermediate electrode 220, the resistance change layer 212, and the ion source layer 216 are stacked in this order between the lower electrode 200 and the upper electrode 208.

In accordance with embodiments of the present disclosure, the first electrode 200 may be made of a wiring material used in a semiconductor process. Examples of the wiring material may include tungsten (W), tungsten nitride (WN), titanium nitride (TiN), carbon (C), copper (Cu), aluminum (Al), molybdenum (Mo), tantalum (Ta), tantalum nitride (TaN), and silicide. In a case in which the first electrode 200 is made of a material, such as Cu, that has a possibility of causing ionic conduction by an electric field, a surface of the first electrode 200 made of Cu or any other wiring material may be covered with a material having barrier properties, such as W, WN, TiN, or TaN, that is less likely to cause ionic conduction and thermal diffusion. In accordance with embodiments of the present disclosure, the first electrode 200 includes titanium. In accordance with still further embodiments of the present disclosure, the first electrode 200 includes titanium aluminum nitride (TiAlN). In accordance with still other embodiments of the present disclosure, the first electrode 200 is formed entirely from TiAlN.

The switch layer 224 includes one or more kinds of Group 16 elements of the periodic table, more specifically, one or more kinds of chalcogen elements such as sulfur (S), selenium (Se) and tellurium (Te). In a switch device 116 exhibiting an ovonic threshold switch (OTS) phenomenon, even if a voltage bias for switching is applied to the switch device 116, it is necessary for a switch layer 224 to maintain an amorphous structure, thereby not causing a phase change, and a relatively stable amorphous structure makes it possible to reliably achieve the OTS phenomenon. In an exemplary embodiment, the switch layer 224 is made of a chalgogenide including one or more kinds of metalloid light elements (first elements), more specifically, boron (B), carbon (C), and silicon (Si) in addition to the above-described chalcogen element. When an element with a relatively small atomic radius is added to an element with a relatively large atomic radius, a difference in atomic radius between the elements becomes large. Accordingly, it is difficult for the switch layer 224 to have a crystalline structure, and the amorphous structure is more likely to be stabilized. Therefore, as with the switch layer 224 in such embodiments, when the metalloid light element with a relatively small atomic radius such as B is added to a chalcogenide including a chalcogen element with a relatively large atomic radius such as Te, a plurality of elements with different atomic radii are included in the chalcogenide, thereby stabilizing the amorphous structure.

Moreover, in addition to reduction in a leakage current by an increase in resistance of the switch layer 224 and stabilization of the OTS phenomenon by stabilization of the amorphous structure, use of a combination of a plurality of kinds of light elements makes it possible to increase a dielectric strength voltage. Accordingly, the switching threshold voltage is increased.

Further, the switch layer 224 may include one or both of nitrogen (N) and oxygen (O). N and O allow the resistance of the switch layer 224 to be increased by being bonded to B, C, or Si. For example, a band gap of a-BN in which B and N are bonded together is 5.05 even in an amorphous state, and $B_2O_3$ in which B and O are bonded together has a band gap of 8.45 eV. Including N or O makes it possible to further increase the resistance value of the switch layer 30 and to reduce the leakage current. Moreover, a bond between the light element and N or O (for example, Si—N, Si—O, B—N, and B—O) contributes to stabilization of the amorphous structure by dispersing the bond in the chalcogenide.

It is to be noted that in order to increase the resistance value and an insulating property of the chalcogenide, the switch layer 224 may include, in addition to the chalcogen element, the light elements of Si, B, and C, and N or O mentioned above, an element that forms a compound with a high band gap, other than the above-described elements. Examples of such an element may include alkaline-earth metal elements such as magnesium (Mg), zinc (Zn), calcium (Ca), and strontium (Sr), Group 13 elements of the periodic table such as aluminum (Al) and gallium (Ga), and rare earth elements such as yttrium (Y) and lanthanoids that are known as Group II-VI compound semiconductors in combination with the chalcogen element. It is estimated that they form a compound with a relatively large band gap in the chalcogenide including nitrogen or oxygen, and it is possible to improve the insulating property of a chalcogenide switch layer in an OFF state in which a voltage is not applied. In particular, most of known chalcogenides including Ge, Sb, As, or any other element have a band gap of lower than 2 eV, and a compound having a band gap of 2.2 eV or higher may be preferably dispersed in the switch layer, which makes it possible to reduce the leakage current.

Accordingly, in a microscopic structure, a high-resistance compound in which the chalcogen element and these elements are bonded together is formed in the switch layer 224, which makes it possible to further reduce the leakage current. Moreover, these elements are bonded to N or O to form a nitride or an oxide. Nitrides of these elements and oxides of these elements have a relatively large band gap, and have higher resistance than the chalcogenide. Therefore, by microscopically dispersing these nitrides and these oxides in the switch layer 224, the resistance of the switch layer 224 is further increased, and the leakage current is reduced while maintaining the OTS phenomenon. In other words, it is possible for the switch layer 224 in this embodiment to maintain the OTS phenomenon caused by the chalcogen element in the ON state upon voltage application as well as to reduce an off current while maintaining a high on current. This makes it possible to increase an ON/OFF ratio (a resistance ratio).

Moreover, the switch layer 224 may include an additive element in addition to the above-described elements. Examples of the additive element may include chromium (Cr), vanadium (V), and niobium (Nb). The additive element reduces variation in an ovonic threshold switch (OTS) operation of the switch device 116 and improves repetition durability of the switch device 116. Further, in order to achieve stabilization of the amorphous structure, etc., an element (for example, germanium (Ge), arsenic (As), and antimony (Sb)) other than these elements may be further included within a range that the element does not impair effects of the invention.

It is to be noted that when the switch layer 224 is too thin, depending on leakage characteristics during non-selection of the materials of the switch layer 224, it is difficult to reduce the leakage current, and the OTS phenomenon is less likely to be caused. Moreover, when the switch layer 224 is too thick, an issue arises in a miniaturization process. Reducing a device size makes it possible to increase a switching threshold voltage, thereby reducing the leakage current. In a miniaturized switch device (a fine device), there is a tendency that a too thick thickness causes an increase in aspect ratio (a size in a plane direction:a size in a vertical direction (a stacking direction)), thereby causing a difficulty in micro-fabrication. Accordingly, the thickness of the switch layer 224 may be preferably within a range of 5 nm to 100 nm both inclusive.

The ion source layer 216 of the storage device 120 includes a mobile element forming a transmission path in the resistance change layer 212 by application of an electric field. Examples of the mobile element may include transition metal elements (Group 4 to 6 elements of the periodic table (for example, Ti, Zr, Hf, V, Nb, Ta, Cr, Mo, and W)), Al, copper (Cu), and chalcogen elements, and the ion source layer 216 includes one kind or two or more kinds selected from them. Moreover, the ion source layer 216 may include O and N, or an element other than the above-described elements, for example, manganese (Mn), cobalt (Co), iron (Fe), nickel (Ni), platinum (Pt), and silicon (Si).

The resistance change layer 212 may be made of, for example, an oxide or a nitride of a metal element or a nonmetal element, and is adapted to change its resistance value when a predetermined voltage is applied between a pair of electrodes (herein, between the third or intermediate electrode 220 and the second or upper electrode 208). More specifically, when a voltage is applied between the intermediate electrode 220 and the upper electrode 208, the transition metal element included in the ion source layer 216 is moved to inside the resistance change layer 212 to form a transmission path, thereby reducing the resistance of the resistance change layer 212. Alternatively, a structural defect such as an oxygen defect or a nitrogen defect occurs in the resistance change layer 212 to form a transmission path, thereby reducing the resistance of the resistance change layer 212. Moreover, when a voltage in a reverse direction is applied, the transmission path is disconnected or conductivity changes, thereby increasing the resistance of the resistance change layer 212.

It is to be noted that all of the metal elements and the nonmetal elements included in the resistance change layer 212 may not be necessarily in an oxide state, and some of them may be oxidized. Moreover, it is only necessary for an initial resistance value of the resistance change layer 212 to achieve a device resistance of about several Mega Ohms to about several hundreds of Giga Ohms, for example. Although an optimum initial resistance value of the resistance change layer 212 varies depending on the size of the device and the resistance value of the ion source layer 216, a thickness of the resistance change layer 212 may be preferably within a range of 0.5 nm to 10 nm both inclusive, for example.

The intermediate electrode 220 may be made of, for example, a material that prevents constituent elements of chalcogenides forming the switch layer 224 and the ion source layer 216 from being dispersed by application of an electric field. This is because, for example, the ion source layer 216 includes transition metal elements (for example, Cu) as elements that perform a memory operation and maintain a writing state, and when these transition metal elements are dispersed in the switch layer 224 by application of an electric field, switch characteristics may be deteriorated. Therefore, examples of a material of the intermediate electrode 220 may include known barrier materials having a barrier property of preventing dispersion of the transition metal elements and ion conduction. The known barrier material may include tungsten (W), tungsten nitride (WN), titanium nitride (TiN), C, tantalum (Ta), tantalum nitride (TaN), and titanium-tungsten (TiW).

The storage device 120 is a resistance-change storage device that changes electrical characteristics (a resistance value) of the storage layer 204 when a voltage pulse or a current pulse is applied from a uniillustrated power supply circuit (a pulse application section) through the first or lower electrode 200 and the third or upper electrode 208, and the storage device 120 performs writing, erasing, and reading of information. It is to be noted that, in the storage device 120, the transmission path formed by voltage application is maintained even after erasing the applied voltage, and the resistance value is maintained.

More specifically, in the storage device 120, when a voltage or a current pulse in a "positive direction" (for example, a negative potential on the intermediate electrode 220 side and a positive potential on the upper electrode 208 side) is applied to the device in an initial state (a high-resistance state), an oxygen defect occurs in the resistance change layer 212 by ionizing metal elements (for example, transition metal elements) included in the ion source layer 216 to disperse the ionized metal elements in the storage layer 204 (for example, in the resistance change layer 212) or by moving oxygen ions. Accordingly, a low-resistance section (a transmission path) in a low-oxidization state is formed in the storage layer 204, and the resistance of the resistance change layer 212 is reduced (a storage state). When a voltage pulse is applied to the device in the low-resistance state toward a "negative direction" (for example, a positive potential on the intermediate electrode 220 side and a negative potential on the upper electrode 208 side), metal ions in the resistance change layer 212 are moved into the ion source layer 216, or oxygen ions are moved from the ion source layer 216 to reduce the oxygen defect of a transmission path portion. Accordingly, the transmission path including the metal elements disappears to turn the resistance of the resistance change layer 212 to a high state (the initial state or an erasing state). It is to be noted that, in a case in which the storage layer 204 has a single-layer configuration of the resistance change layer 212, when a voltage (or a current pulse) in the positive direction is applied, a defect occurs by an electric field applied to the resistance change layer 212, and the defect forms a transmission path to reduce the resistance of the resistance change layer 212. When a voltage pulse in the negative direction is applied in this state, movement of oxygen ions or nitrogen ions in the resistance change layer 212 causes a reduction in the defect, that is, disconnection of the transmission path, thereby increasing the resistance.

Figure 3:
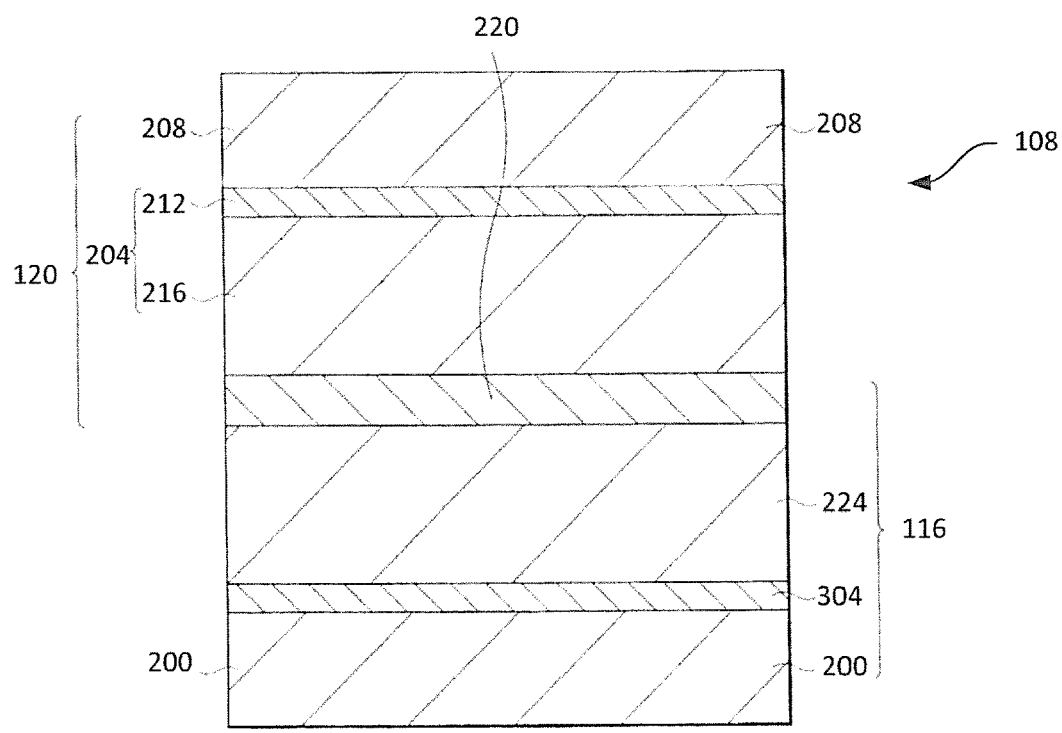
FIG. 3 is a cross-sectional view depicting a memory cell in accordance with other embodiments of the present disclosure.
Figure 4:
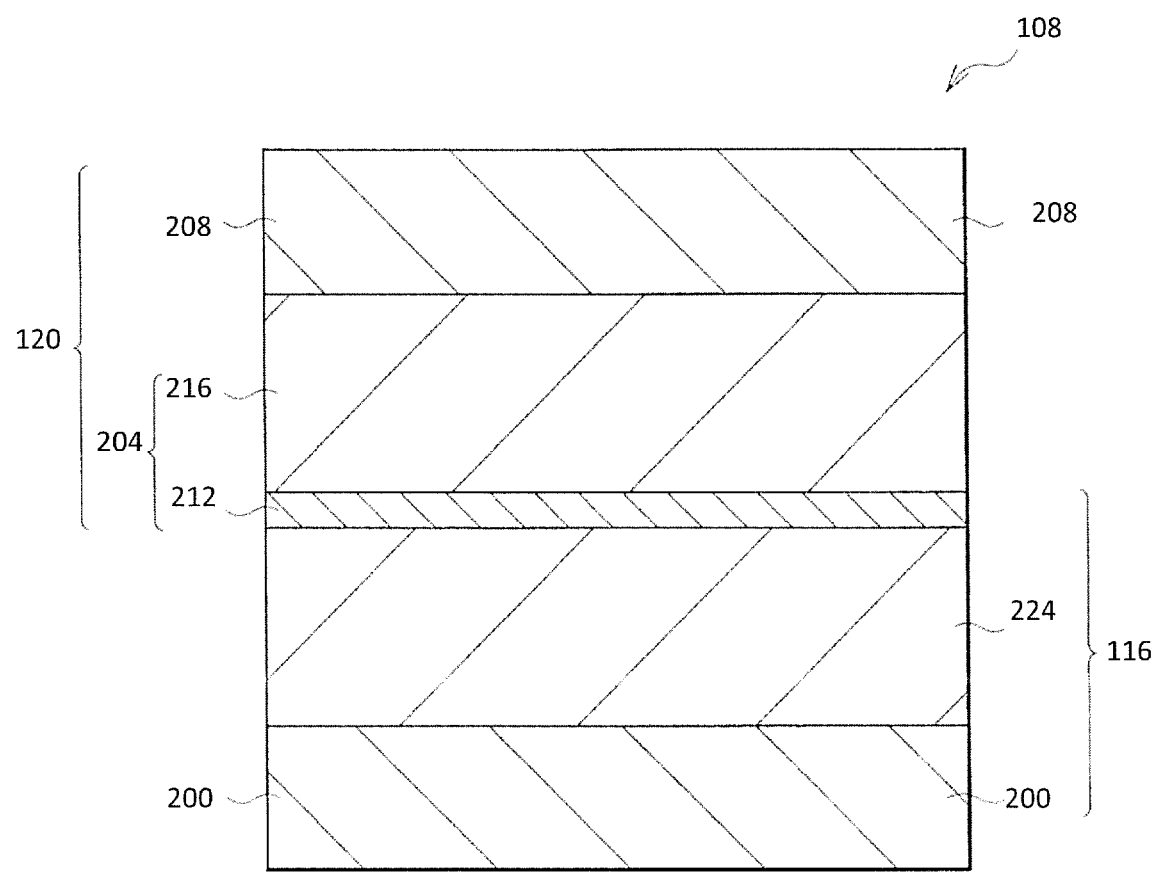
FIG. 4 is a cross-sectional view depicting a memory cell in accordance with other embodiments of the present disclosure.

It is to be noted that the stacking order of the stacking configuration of the switch device 116 and the storage device 120 in the memory cell 108 is not limited to that in a memory cell 108 illustrated in FIG. 2. For example, in an alternate configuration of a memory cell 108 illustrated in FIG. 3, the switch device 116 may be configured with an additional high-resistance layer 304 and the switch layer 224 stacked in order from the lower electrode 200 side, and the ion source layer 216 and the resistance change layer 212 are further stacked on the switch layer 224 with the intermediate electrode 220 in between. Alternatively, a configuration without the intermediate electrode 220 may be adopted. In this case, for example as illustrated in FIG. 4, the switch layer 224, the resistance change layer 212, and the ion source layer 216 may be stacked in order from the lower electrode 200 side.

Moreover, the switch layer 224 and the storage layer 204 may be so formed as to change the stacking order thereof. Further, production and erasing of the transmission path in the above-described high-resistance layer 304 are similar to operations in the resistance change layer 212 in the storage device 120; therefore, the high-resistance layer 304 and the resistance change layer 212 may be shared with each other. Accordingly, the switch layer 224 and the ion source layer 216 may be so disposed with the high-resistance layer 304 in between as to allow the high-resistance layer 304 of the switch layer 224 to also serve as the resistance change layer 212 of the storage layer 204. Furthermore, two resistance change layers 212 may be provided on both the lower electrode 200 side and the upper electrode 204 side of the ion source layer 216 and may be stacked with the switch layer 224.

It is to be noted that, in a memory cell array 100 of embodiments of the present disclosure, for example, a so-called resistance-change storage device (memory device) including a storage layer 204 in which the ion source layer 216 and the resistance change layer 212 are stacked is used as the storage device 120; however, the storage device 120 is not limited thereto. For example, a resistance-change memory made of a transition metal oxide, a PCM (phase-change memory), or an MRAM (magnetic random access memory) may be used as the storage device 120.

The upper or third electrode 208 may use a known semiconductor wiring material. A stable material that does not react with the switch layer 224 even after post annealing may be preferable.

As described above, a switch device 116 according to embodiments of the present disclosure enters a reduced resistance state by applying a voltage equal to or higher than a certain voltage without phase change between an amorphous phase and a crystalline phase, and returns to a high-resistance state by reducing the applied voltage to a voltage lower than the certain voltage. The certain voltage is referred to as a switching threshold voltage. In other words, in the switch device 116, a phase change is not caused in the switch layer 224 by application of a voltage pulse or a current pulse from an unillustrated power supply circuit (a pulse application section) through the first electrode 200 and the third electrode 208. Moreover, the switch device 116 does not perform a memory operation such as maintaining a transmission path formed by ion movement by voltage application even after erasing the applied voltage. Further, the switch device 116 according to such embodiments is used as a selection device that selectively operates a certain memory device 120 in a memory cell array 100 in which a plurality of memory devices 120 are arranged as described above.

An increase in capacity has been demanded in nonvolatile memories (storage units) for data storage, and use of a cross-point array configuration makes it possible to achieve the increase in capacity. In a cross-point array type storage unit (a memory cell array), memory cells configured of the memory device 120 and the switch device 116 are each provided at corresponding one of cross points of intersecting wiring lines. For example, a resistance-change memory device may be used for the memory device 120, which makes it possible to achieve a further increase in capacity and an improvement in reliability. However, for example, a resistance-change memory device having high reliability such as data storage characteristics in resistance-change memory devices typically has a high writing threshold voltage (for example, 1V or higher), or further miniaturization of the resistance-change memory device may further increase the writing threshold voltage. It is therefore desirable that a switch device used in combination with the above-described memory device having high reliability have a large switching threshold voltage.

Moreover, in order to operate a memory cell array of several kBits or more, for example, it is necessary to reduce the leakage current during non-selection (OFF) of the switch device as described above. This is because a failure such as a writing error occurs in a case in which the leakage current is large. Further, in a miniaturized storage unit, in order to obtain a current necessary to operate the memory device, high current density in the ON state is necessary. Accordingly, in the switch device, a large selection ratio (a high on current and a low leakage current) is necessary.

As the switch device having a suitable ON/OFF ratio, an OTS device using a chalcogenide material can be adopted. In the OTS device, an OTS layer provided between electrodes may be made of, for example, a chalcogenide such as GeTe, GeSbTe, GeSiAsTe, GeSe, GeSbSe, GeSiAsSe, GeS, GeSbS, or GeSiAsS. In accordance with further embodiments of the present disclosure, an OTS layer can include, boron, carbon, or other materials. Thus other examples of materials for forming an OTS layer include combinations of B+C+Si+Ge and S+Se+Te. The electrodes generally oppose each other. The switch device made of any of these chalcogenides has a characteristic (ovonic threshold switch) in which a current is abruptly increased at a certain threshold voltage or higher; therefore, the switch device obtains relatively large current density in the ON state, as compared with other switch devices such as the PN diode. However, the switching threshold voltage is not sufficiently high, and in a case in which the resistance-change memory device with a high writing threshold voltage and the OTS device are combined together, the OTS device is switched before the memory device is switched. This causes an issue in which a voltage margin for reading or writing is narrowed. Moreover, the leakage current in the non-selection (OFF) state is large, which easily causes a malfunction (a writing error or an erasing error). In particular, in a large memory cell array, the issue of the leakage current becomes serious in proportion to the size of the memory cell array; therefore, a larger ON/OFF ratio is desirable to increase the writing/reading margin.

Moreover, the band gap of the chalcogenide forming a typical switch device is about 2.2 eV at most. Therefore, with a thickness allowing for miniaturization (for example, 100 nm or less), it is difficult to sufficiently reduce the leakage current.

In accordance with at least some embodiments of the present disclosure, the switch layer 224 is formed % with use of the chalcogen element such as Te, Se, and S, one or more kinds selected from Si, B, and C, and one or both of O and N. The switch layer 224 increases the resistance value by dispersing a high-resistance element (for example, B or Si) or a high-resistance compound (for example, BN, $B_2O_3$, SiN, SiC, and $SiO_2$), thereby reducing the leakage current in the OFF state.

Moreover, in such an embodiment, the addition of an element such as B, C, Si, N, or O to the chalcogenide stabilizes the amorphous structure, thereby obtaining a stable OTS phenomenon and remarkably reducing the resistance value in the ON state. Further, the metalloid light element has relatively large binding energy with the chalcogen element; therefore, the metalloid light element makes it possible to increase a breakdown voltage, thereby increasing an ovonic threshold voltage. This makes it possible to increase the ON/OFF ratios of a current in the selection state and the non-selection state and the value of the switching threshold voltage. Further, it is possible to reduce the leakage current by dispersing a compound with a large band gap such as BN, SiN, or SiCN in the switch layer 224.

Figure 5:
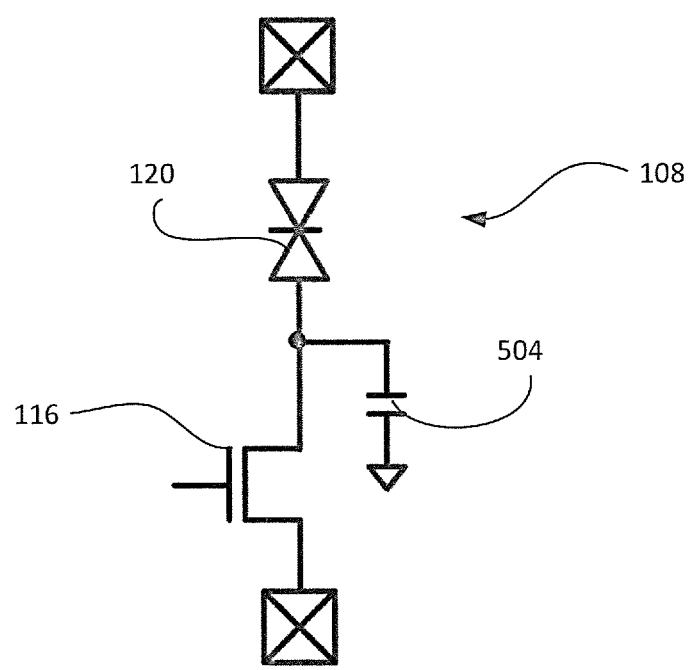
FIG. 5 is a schematic depiction of a memory cell in accordance with embodiments of the present disclosure.

Another consideration is the current spike that occurs when the voltage drop across a memory cell 108 abruptly decreases during a memory cell 108 operation. This phenomena, referred to as "snap back" or "snap voltage", is a property of the storage device 120, and typically occurs when a voltage that is above a certain voltage threshold value is applied across the memory cell 108, resulting in an abrupt decrease in the resistance across the memory cell 108. Moreover, when it occurs, the realized peak current values can be relatively high (e.g. greater than 500 micro Amps). In addition, as depicted in FIG. 5, as a result of the wiring within the cells 108 of the memory cell array 100, including but not limited to the wiring lines 104 and 112, and the electrodes 200, 208, and 220, the capacitance 504 within the circuit of a memory cell 108, and in particular between the switching device 116 and the storage device 120, can be relatively high (e.g. 5 femto Farads). As a result, the current spike experienced during snap back of about 500 micro Amps can persist for 0.1 ns. This can in turn degrade the reliability of the switch device 116.

The inventors have recognized that the peak current experienced during snap back or snapping can be reduced by using a higher resistance first or bottom electrode 200. The inventors have further recognized that simply using a higher resistance electrode does not necessarily result in a satisfactory configuration. For example, it is desirable to provide an electrode 200 that features reduced current at elevated voltages as compared to alternatives. In addition, it is desirable to obtain high cycling endurance. In order to achieve such performance, the inventors have developed a memory cell with a first or bottom electrode 200 that includes titanium. In accordance with at least some embodiments, the first electrode 200 is formed at least partially from TiAlN. In accordance with still further embodiments, the first electrode is formed entirely from TiAlN. The use of TiAlN is advantages for various reasons. For example, TiAlN provides increased electrical resistance, with reduced peak current and with excellent cycling endurance as compared to conventional bottom electrode configurations. The use of TiAlN also allows the electrodes, including the first 200 and second 220 electrodes, to be formed using physical vapor deposition (PVD). In accordance with at least some embodiments of the present disclosure, the resistance of the bottom electrode 200 is at least 12,500 Ohms. In addition, TiAlN can be deposited with better uniformity than other possible high resistance electrode materials, such as (W, Ti, Ta, Co, Mo)+(Si, C, Al)+N. The favorable cycling endurance of TiAlN as compared to other electrode materials can be due to better film quality. In at least some embodiments, an electrode formed from TiAlN is at least 70% Al. In accordance with still other embodiments of the present disclosure, the bottom electrode 200 can be formed from TiCN, which can be deposited by TDMAT. In accordance with further embodiments of the present disclosure, any or all of the electrodes 200, 208, and 220 can be formed from or can include TiAlN. In addition, TiAlN, such as in the form of a layer, can be inserted anywhere between the first electrode 200, the switch layer 224, the second electrode 220, the storage layer 204, and/or the third electrode 208.

Figure 6:
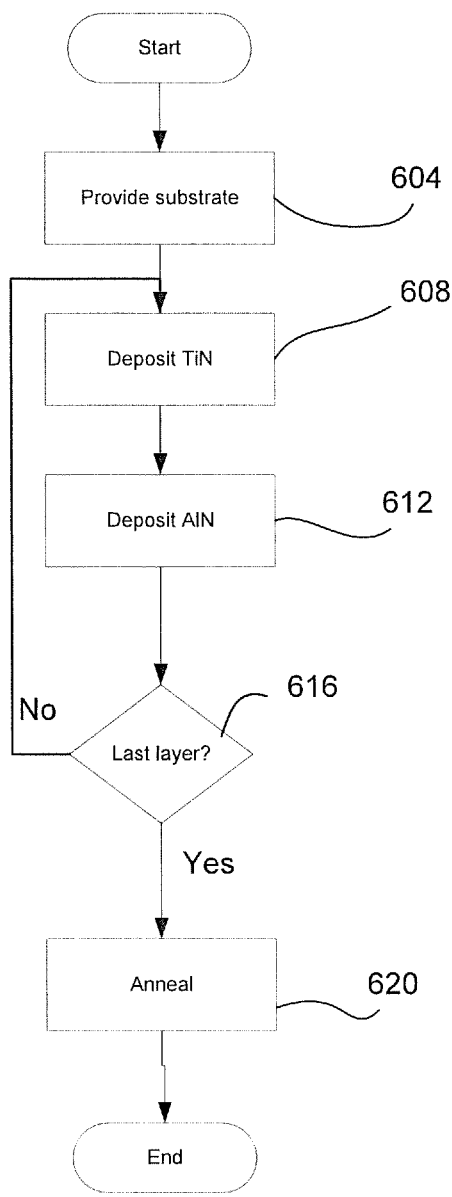
FIG. 6 depicts aspects of a method for forming a high resistance electrode in accordance with embodiments of the present disclosure.

In accordance with embodiments of the present disclosure, a method for providing a first electrode 200 configured to provide high resistance in the presence of a snap current is provided. More particularly, FIG. 6 depicts aspects of a method for forming a high resistance electrode in accordance with embodiments of the present disclosure. The method can include providing a substrate (step 604). The method can further include depositing materials forming the first electrode 200 on a substrate using atomic layer deposition (ALD). The deposition, can include a step of depositing a layer of TiN (step 608), and a step of depositing a layer of AlN (step 612). Alternately, a layer of AlN can be deposited, followed by a layer of TiN. The TiN can be deposited using a nitrogen carrier flow into which titanium tetrachloride ($TiCl_4$) is introduced. The AlN can be deposited using a nitrogen carrier flow into which trimethylaluminum (TMA) is introduced. The steps of depositing TiN, and of depositing AlN can be performed alternately, multiple times (step 616). For example, but without limitation, the steps can be performed alternately 135 times. Following the steps of depositing TiN and AlN multiple times, an $NH_3$ anneal process can be performed on the deposited layers (step 620). As an example, but without limitation, the deposition and annealing steps can be performed so as to achieve an electrode 200 comprising TiAlN. Moreover, the electrode 200 can be formed to have a thickness of 400 Å.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. A method for producing a first electrode of a memory cell, comprising:
    depositing a layer of TiN on a substrate;
    depositing a layer of AlN on the substrate;
    repeating the steps of depositing a layer of TiN and of depositing a layer of AlN multiple times; and
    after repeating the steps of depositing a layer of TiN and of depositing a layer of AlN multiple times, performing $NH_3$ annealing of the deposited layers,
    wherein the first electrode includes titanium aluminum nitride (TiAlN).

2. The method of claim 1, wherein the first electrode is formed entirely from TiAlN.

3. The method of claim 1, wherein the first electrode is at least 70% Al.

4. The method of claim 1, wherein a resistance of the first electrode is at least 12,500 Ohms.

5. The method of claim 1, wherein the steps of depositing a layer of TiN and of depositing a layer of AlN is repeated 135 times.

6. The method of claim 1, wherein depositing the layer of TiN comprises using a nitrogen carrier flow into which titanium tetrachloride ($TiCl_4$) is introduced.

7. The method of claim 1, wherein depositing the layer of AlN comprises using a nitrogen carrier flow into which trimethylaluminum (TMA) is introduced.

8. The method of claim 1, wherein the first electrode has a thickness of 400 A.

9. The method of claim 1, wherein the first electrode is formed using atomic layer deposition (ALD).

10. The method of claim 1, wherein the first electrode features reduced current at elevated voltages.

11. The method of claim 1, wherein the first electrode provides an increased electrical resistance with a reduced peak current.

12. The method of claim 1, wherein the layer of AlN is deposited on the substrate first.

* * * * *